(12) United States Patent
Nikitin et al.

(10) Patent No.: US 6,901,573 B2
(45) Date of Patent: May 31, 2005

(54) METHOD FOR EVALUATING LOGIC FUNCTIONS BY LOGIC CIRCUITS HAVING OPTIMIZED NUMBER OF AND/OR SWITCHES

(75) Inventors: Andrey A. Nikitin, Moscow (RU); Alexander E. Andreev, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 68 days.

(21) Appl. No.: 10/382,036

(22) Filed: Mar. 5, 2003

(65) Prior Publication Data

US 2004/0177330 A1 Sep. 9, 2004

(51) Int. Cl.[7] .............................................. G06F 17/50
(52) U.S. Cl. .............................. 716/18; 716/1; 716/3; 716/4; 716/5
(58) Field of Search .......................... 716/1, 3, 4, 5, 716/18

(56) References Cited

U.S. PATENT DOCUMENTS

| 5,557,797 A | * | 9/1996 | Yano ............................ 717/124 |
| 6,433,588 B1 | * | 8/2002 | Yamashita et al. ........... 326/113 |
| 6,728,939 B2 | * | 4/2004 | Johannsen ..................... 716/5 |

* cited by examiner

*Primary Examiner*—Vuthe Siek
(74) *Attorney, Agent, or Firm*—Suiter West PC LLO

(57) ABSTRACT

A method for creating a logic circuit with an optimized number of AND/OR switches, which evaluates a logic function defined in a high-level description. Through analyzing the dependency relationship among operators used to define the logic function, the present invention may simplify the functional steps used in the high-level description to define the logic function and thus create a logic circuit with an optimized number of AND/OR switches.

23 Claims, 3 Drawing Sheets

```
int FUNC(int x1, int x2, int x3, int y1, int y2, int y3)
{           // operator 1
    int result;
    result = 0;
    if (x1)                         // operator 2
    {                               // operator 3
        if (!x2)                    // operator 4
            result = y2;            // operator5
        else
            result = y3;            // operator 6
        if (x3)                     // operator 7
            result = y3;            // operator 8
    }
    if (x3)                         // operator 9
        result = y1;                // operator 10
    return result;
}
```

```
AllParents(1) = {1}
AllParents(5) = {5,4,3,2,1}
AllParents(6) = {6,4,3,2,1}
AllParents(8) = {8,7,3,2,1}
AllParents(9) = {9,1}
AllSeqParents(10) = {1}
AllSeqParents(5) = {3,1}
AllParentsBeforeSeq(5) = {5,4}
common(5,6) = 4
common(5,8) = 3
common(5,10) = 1
```

```
int FUNC(int x1, int x2, ... int xn, int y1, int y2, ... int ym)
{
        int result;
        result = 0;
        PROGRAM return result;
}
```

```
int FUNC(int x1, int x2, int x3, int y1, int y2, int y3)
{               // operator 1
    int result;
    result = 0;
    if (x1)                          // operator 2
    {                                // operator 3
        if (!x2)                     // operator 4
            result = y2;             // operator 5
        else
            result = y3;             // operator 6
        if (x3)                      // operator 7
            result = y3;             // operator 8
    }
    if (x3)                          // operator 9
        result = y1;                 // operator 10
    return result;
}
```

*FIG. 3*

*AllParents(1) = {1}*
*AllParents(5) = {5,4,3,2,1}*
*AllParents(6) = {6,4,3,2,1}*
*AllParents(8) = {8,7,3,2,1}*
*AllParents(9) = {9,1}*
*AllSeqParents(10) = {1}*
*AllSeqParents(5) = {3,1}*
*AllParentsBeforeSeq(5) = {5,4}*
*common(5,6) = 4*
*common(5,8) = 3*
*common(5,10) = 1*

*FIG. 4*

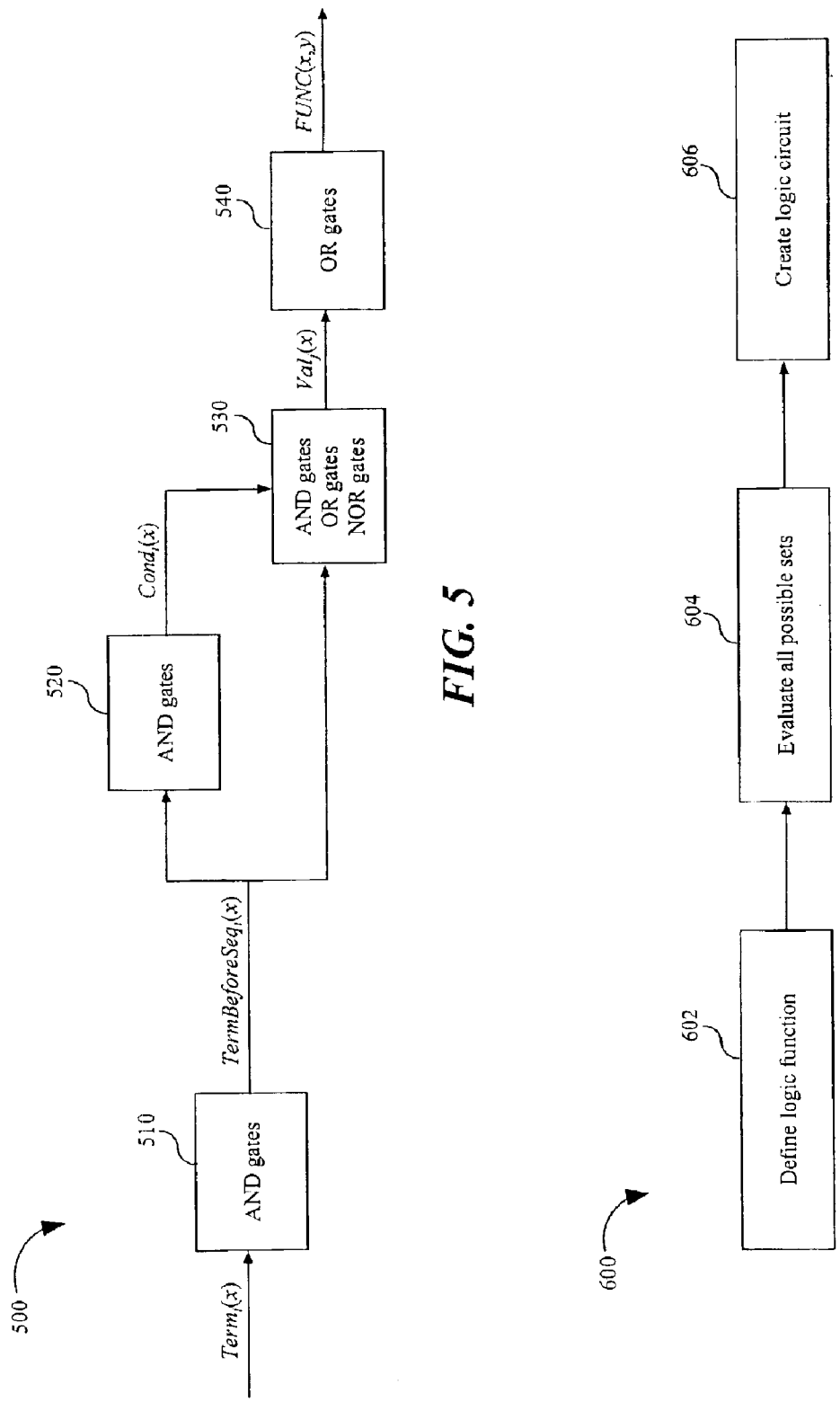

METHOD FOR EVALUATING LOGIC FUNCTIONS BY LOGIC CIRCUITS HAVING OPTIMIZED NUMBER OF AND/OR SWITCHES

FIELD OF THE INVENTION

The present invention relates generally to integrated circuit design, and particularly to a method for evaluating a logic function by a logic circuit having an optimized number of AND/OR switches.

BACKGROUND OF THE INVENTION

Integrated circuits (ICs) are often designed at a high-level of abstraction. For example, ICs may be described in a C++ code, in a RTL (register transfer level) hardware description language such as Verilog HDL or VHDL, or, indeed, in any other programming or hardware description languages. The IC designed at a high-level of abstraction has to be synthesized logically. The gate-level synthesis is a process of generating a logic circuit according to the high-level description. Often, this is a costly and lengthy process.

One of the most important problems during IC development is to reduce the timing and area characteristics of the IC. To save the IC real estate and improve the efficiency, it is a priority to reduce the number of AND/OR switches in a logic circuit that evaluates a logic function defined in a high-level description. An AND/OR switch is a situation in which two neighboring gates on a path from an input of a logic circuit to an output of the logic circuit are of different types. The maximal number of AND/OR switches included on considered paths is called the number of AND/OR switches.

The logic function to be evaluated may be a Boolean function. It is well known that each Boolean function may be presented as a disjunction of conjunctions, which may be referred to as a disjunction normal form (DNF), and thus may be evaluated by the Boolean circuit having only AND/OR switches. However, this Boolean circuit may have a large complexity and the creation of this circuit is a NP-hard problem. NP-hard (Non-deterministic Polynomial-time hard) refers to the class of decision problems that contains all problems H such that for all decision problems L in NP there is a polynomial-time many-one reduction to H. Informally this class may be described as containing the decision problems that are at least as hard as any problem in NP. This intuition may be supported by the fact that if we can find an algorithm A that solves one of these problems H in polynomial time, then we may construct a polynomial time algorithm for every problem in NP by first executing the reduction from this problem to H and then executing the algorithm A.

Therefore, it would be desirable to provide a method for creating a logic circuit with an optimized number of AND/OR switches, which evaluates a logic function defined in a high-level description.

SUMMARY OF THE INVENTION

Accordingly, the present invention discloses a method for creating a logic circuit with an optimized number of AND/OR switches, which evaluates a logic function defined in a high-level description. Through analyzing the dependency relationship among operators used to define the logic function, the present invention may simplify the functional steps used in the high-level description to define the logic function and thus create a logic circuit with an optimized number of AND/OR switches.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 3 is an exemplary C++ code depicting the operators of the C++ program in the order of the operator's presence in the C++ code in accordance with an exemplary embodiment of the present invention;

FIG. 4 depicts the dependency relationship among the operators shown in FIG. 3;

FIG. 5 is a schematic diagram showing a logic circuit with an optimized number of AND/OR switches created to evaluate a logic function defined in a high-level description in accordance with an exemplary embodiment of the present invention; and FIG. 6 is an exemplary process used to create a logic circuit with an optimized number of AND/OR switches to evaluate a logic function defined in a high-level description in accordance with an exemplary embodiment of the present invention.

DETAILED DESCRIPTION OF THE INVENTION

Figures 1, 2:
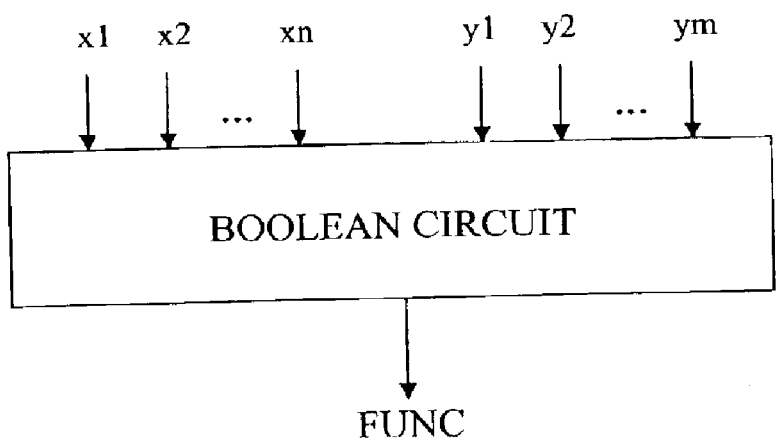
FIG. 1 shows a Boolean function FUNC defined in C++ language in accordance with an exemplary embodiment of the present invention.
FIG. 2 shows the Boolean function FUNC of FIG. 1 being evaluated by a Boolean circuit in accordance with an exemplary embodiment of the present invention.

Reference will now be made in detail to the presently preferred embodiments of the invention, examples of which are illustrated in the accompanying drawings.

As shown in FIG. 1, an exemplary logic function FUNC is determined by means of C++ functions. Inputs $x_1, x_2, \ldots, x_n, y_1, y_2, \ldots, y_m$, $n \geq 1$, $m \geq 1$ may take values of only 0 (low) and 1 (high). Inputs $x_1, x_2, \ldots, x_n$ may be called control inputs, and inputs $y_1, y_2, \ldots, y_m$ may be called data inputs.

In FIG. 1, the C++ program PROGRAM may include operators of the following three types:

1) IF-operators, which may be defined as follows:
   if($x_i$) positive_operator else negative_operator or
   if($\neg x_i$) negative_operator else positive_operator
   ($\neg$ represents a NOT function). It should be noted that the else option may be absent without departing from the spirit and scope of the present invention.

2) EQ-operators, which may be defined as follows:
   result=$y_i$;

3) SEQ-operators, which may be defined as follows:
   {child_operator1 child_operator2 . . . child_operatorK}

Therefore, for each set of values of control and data inputs, the function FUNC returns a value 0 (low) or 1

(high). Thus, the function FUNC may be considered as a Boolean function.

As shown in FIG. 2, in an exemplary embodiment of the present invention, the present invention is devoted to the evaluation of the Boolean function FUNC as shown in FIG. 1, by means of a Boolean circuit created from the library elements: NOT (NOT gate), AND (2-input AND gate), and OR (2-input OR gate).

The maximal length of any path from any input of a Boolean circuit to the output may be called depth of the Boolean circuit, and the number of gates (AND, OR, NOT) may be called complexity of the Boolean circuit.

One of the most important problems during IC development is to reduce the timing and area characteristics of the IC. Through use of the present invention, minimization of depth and complexity of Boolean circuits may be utilized to optimize and reduce the complexity of an IC.

For instance, through use of an exemplary method of the present invention, a method for synthesizing Boolean circuits is provided that evaluates functions FUNC defined in a C++ code. This method allows the creation of Boolean circuits with low complexity and high ability of depth optimization. The term "ability of depth optimization" pertains to the approach to develop large IC chips from several small parts (called modules). Preferably, these small modules may be easily optimized separate from each other. Typically during this optimization, it is desirable that all inputs of each module have the same arrival depth.

However, the most difficult optimization problem arises when the developer starts to interconnect small modules to arrive at a single large integrated circuit, such as an application specific integrated circuit (ASIC), system-on-chip (SOC), general purpose integrated circuit, and the like. Because the inputs of one module may become the outputs of another module (or several other modules), different arrival depths may be encountered, and thus the module may need to be optimized again ("re-optimized") for the given set of the arrival depths of the module's inputs. The term "ability of depth optimization" means that the module may be simply optimized and re-optimized to reduce the depth.

Each Boolean circuit may be split into a set of uniform sub-trees, which are the trees that consist of OR elements only or of AND elements only. Reducing the number of these uniform sub-trees may optimize the circuit depth. The number of uniform sub-trees depends from one important characteristic of the Boolean circuit that is called the number of AND/OR switches. In order to determine the number of AND/OR switches, all the paths from any input of a Boolean circuit to its output should be examined. Each path may include gates of types NOT, AND and OR. The AND/OR switch is a situation in which two neighboring gates on the path are of different types. The maximal number of switches included on considered paths is called the number of AND/OR switches. Therefore, the smaller the number of AND/OR switches, the smaller the number of uniform sub-trees.

Each Boolean function may be presented as a disjunction of conjunctions, which may be referred to as a disjunction normal form (DNF), and thus may be evaluated by the Boolean circuit having only AND/OR switches. However, this Boolean circuit may have a large complexity and the creation of this circuit is a NP-hard problem.

The present invention presents a method of rapid synthesis of the Boolean circuit with an optimized number of AND/OR switches and low complexity.

Before the description of the method of the present invention, the following terms may be defined. The operators "positive_operator" and "negative_operator", as discussed previously, are called children of the IF-operator, and the operators "child_operator1", "child_operator2", ... "child operatorK" are called children of the SEQ-operator. The operator "positive_operator" is called a positive child of the IF-operator, and the operator "negative_operator" is called a negative child of the IF-operator. The IF-operator is called a parent of operators "positive_operator" and "negative operator", and the SEQ-operator is called a parent of operators "child_operator1", "child_operator2", ... "child operatorK". The input $x_i$ is called control input of the IF-operator.

Let us enumerate all the operators of a C++ program in the order of the operator's presence in the C++ code as shown in FIG. 3. Preferably, the number 1 is always assigned to the top-level SEQ-operator. This operator is the only operator that has no parent. Operators 2 and 9 are children of operator 1. The operator 3 is a positive child of the operator 2, the operator 4 is a child of the operator 3, and continuing likewise. Thus all the operators have a unique number op=1, N.

For example, $OP_i$ may be an operator with number i. For each $i=\overline{1, N}$ par(i) may be a number of the parent of the operator $OP_i$. We may assign par(1)=1.

For purposes of the following discussion, x may be denoted as equal to $(x_1, x_2, \ldots, x_n)$, and instead of denoting each Boolean function that depends from variables $x_1, x_2, \ldots, x_n$ as $f(x_1, x_2, \ldots, x_n)$, the function may be written as $f(x)$ for the sake of simplifying the discussion.

Define a function $Term_i(x)$, $i=\overline{1, N}$:
a) $Term_i(x)$ 1 if $OP_{par(i)}$ is a SEQ-operator;
b) $Term_i(x)=x_j$ if $OP_{par(i)}$ is an IF-operator with control input $x_j$ and $OP_i$ is a positive child;
c) $Term_i(x)=\neg x_j$ if $OP_{par(i)}$ is an IF-operator with control input $x_j$ and $OP_i$ is a negative child.
(Def. 1)

The present discussion will now refer to the process of execution of the C++ program. During this process, all the operators are executed in the order of the operator's enumeration. For example, after the execution of the operator $OP_i$, the operator $OP_{i+1}$ may be executed. Preferably, the only exception that breaks this order occurs when executing an IF-operator. After the execution of IF-operator, the process may jump to one of two operators; negative child or positive child. If the process jumps to the positive child, the negative child is not executed (and vise versa). Thus, for each set of values of the control inputs $x_1, x_2, \ldots, x_n$ some of the operators are executed and others are not executed. Let $Cond_i(x)$ be a Boolean function that takes value 1 if and only if the operator $OP_i$ is executed when the input values are $x_1, x_2, \ldots, x_n$. Thus, the following is true.

$$Cond_i(x) = Cond_{par(i)}(x) \wedge Term_i(x) \qquad \text{Equation (1)}$$

($\wedge$ represents an AND function). It should be noted that the considered Boolean function FUNC(x,y) may take only the next values $0, y_1, y_2, \ldots, y_m$. Let $Val_k(x)$, $k=\overline{1,m}$ be a Boolean function that may take value 1 if and only if FUNC(x,y)=$y_j$, therefore the following may be written.

$$FUNC(x, y) = \bigvee_{j=1}^{m} Val_j(x) \cdot y_j \qquad \text{Equation (2)}$$

(the middle dot "." represents an AND function, V represents an OR function).

Let $Y_j, j=\overline{1,m}$ be a set of numbers of all operators with type result=$y_j$ and $$Y = \bigcup_{j=1}^{m} Y_j$$

($\cup$ sets a theoretic union).

FUNC(x,y) may be equal to $y_j$ when and only when the operator $OP_i$, $i \in Y_j$, executes and for every $s>i$, $s \in Y\setminus Y_j$, operator $OP_s$ does not execute. ($\in$ sets membership; $\setminus$ sets a theoretic complement).

Consequently, the following may be written:

$$Val_j(x) = \bigvee_{i \in Y_j} [Cond_i(x) \cdot \bigwedge_{s>i, s \in Y\setminus Y_j} \neg Cond_s(x)]$$

Denote Boolean Function $$BothCond_{i,s}(x) = Cond_i(x) \wedge Cond_s(x), \quad 1 \leq i \leq s \leq N$$

Using this function, the following may be written:

$$Val_j(x) = \bigvee_{i \in Y_j} [Cond_i(x) \cdot \bigwedge_{s>i, s \in Y\setminus Y_j} \neg BothCond_{i,s}(x)] \quad \text{Equation (3)}$$

Denote $par_0(i)=i$, $par_{t+1}(i)=par(par_t(i))$, $i=\overline{1,N}$, $t \geq 0$. For each $i=\overline{1,N}$ consider the next sequence $par_0(i)$, $par_1(i)$, $par_2(i)$, ... Let $d(i) \geq 0$ be a minimal number so that $par_t(i)=1$ for each $t \geq d(i)$. The magnitude $d(i)$ may be determined as a depth of the operator $OP_i$ in the C++ program.

For each $i=\overline{1,N}$ define the set $$AllParents(i) = \{par_0(i), par_1(i), \ldots, par_{d(i)}(i)\} \quad \text{(Def. 2)}$$

Using Equation (1), the following may be determined:

$$Cond_i(x) = \bigwedge_{t \in AllParents(i)} Term_t(x) \quad \text{Equation (4)}$$

Let $seq(i) \geq 1$ be a minimal number so that the operator $OP_{par_{seq(i)}(i)}$ is a SEQ-operator and define the set $$AllParentsBeforeSeq(i) = \{par_0(i), par_1(i), \ldots, par_{seq(i)-1}(i)\} \quad \text{(Def. 3)}$$

Define $$AllSeqParents(i) = \{par_{seq(i)}(i), par_{seq(seq(i))}(i), \ldots, par_{d(i)}(i)\} \quad \text{(Def. 4)}$$

Thus, the following may be determined:

$$AllParents(i) = \bigcup_{t \in \{i\} \cup AllSeqParents(i)} AllParentsBeforeSeq(t) \quad \text{Equation (5)}$$

Determine $$TermBeforeSeq_i(x) = \bigwedge_{t \in AllParentsBeforeSeq(i)} Term_t(x), \quad i = \overline{1,N} \quad \text{Equation (6)}$$

Consequently, using Equations (4), (5) and (6), the following may be determined:

$$Cond_i(x) = \bigwedge_{t \in \{i\} \cup AllSeqParents(i)} TermBeforeSeq_t(x), \quad i = \overline{1,N} \quad \text{Equation (7)}$$

Consider the function $ContrCond_{i,s}(x)$, $1 \leq i \leq s \leq N$ and two sequences of parents:

$par_0(i), par_1(i), \ldots, par_{d(i)}(i)$
$par_0(s), par_1(s), \ldots, par_{d(s)}(s)$ So long as $par_{d(i)}(i) = par_{d(s)}(s) = 1$, there exists a minimal $d(i,s) \leq d(s)$ so that the ends of length $(d(s)-d(i,s)+1)$ of both considered sequences $par_{d(i)+d(i,s)-d(s)}(i), \ldots, par_{d(i)}(i)$
$par_{d(i,s)}(s), \ldots, par_{d(s)}(s)$ are the same.

Define $$common(i,s) = par_{d(i,s)}(s) \quad \text{(Def. 5)}$$

The $common(i,s)$ is a number of an operator which is the first common parent operator for both operators $OP_i$ and $OP_s$.

Now, the dependency relationship among the operators shown in FIG. 3 may be illustrated in FIG. 4. For example, AllParents(8) depends on operators 8, 7, 3, 2, and 1, and Common(5,8) depends on operator 3. Thus the functional steps used in C++ language to define the Boolean function FUNC shown in FIG. 3 may be simplified, and a Boolean circuit with an optimized number of AND/OR switches may be created to evaluate the Boolean function FUNC.

If the operator $OP_{common(i,s)}$ is an IF-operator, it means that operators $OP_i$ and $OP_s$ may not be executed simultaneously for the same values of control inputs $x_1, x_2, \ldots, x_n$. Consequently, for such a pair $(i,s)$, $BothCond_{i,s}(x)$ is equal to zero for each value of x. In FIG. 3, the first common operator for the operators $OP_5$ and $OP_6$ is the IF-operator $OP_4$. Thus, for these two operators $BothCond_{5,6}(x)=0$.

If the operator $OP_{common(i,s)}$ is a SEQ-operator, the following may be written:

$$BothCond_{i,s}(x) = \quad \text{Equation (8)}$$
$$Cond_i(x) \wedge \bigwedge_{\substack{t \in \{s\} \cup AllSeqParents(s) \\ t < common(i,s)}} TermBeforeSeq_i(x)$$

The foregoing Equations (1)–(8) define the Boolean circuit that evaluates the considered Boolean function FUNC (x,y). These eight equations may be rewritten as the following four equations:

$$TermBeforeSeq_i(x) = \bigwedge_{t \in AllParentsBeforeSeq(i)} Term_t(x), \quad i = \overline{1,N} \quad \text{Equation (6)}$$

$$Cond_i(x) = \bigwedge_{t \in \{i\} \cup AllSeqParents(i)} TermBeforeSeq_i(x), \quad i = \overline{1,N} \quad \text{Equation (7)}$$

$$Val_j(x) = \bigvee_{i \in Y_j} [Cond_i(x) \cdot \bigwedge_{\substack{s>i \\ s \in Y\setminus Y_j}} \quad \text{Equation (9)}$$
$$\neg \{ \bigwedge_{\substack{t \in \{s\} \cup AllSeqParents(s) \\ t < common(i,s)}} TermBeforeSeq_i(x) \} ]$$

$$FUNC(x, y) = \bigvee_{j=1}^{m} Val_j(x) \cdot y_j \quad \text{Equation (2)}$$

As shown in FIG. 5, a Boolean circuit 500 may be created according to Equations (6), (7), (9), and (2) to evaluate a logic function FUNC(x,y). The Boolean circuit 500 may include a first part 510 which may consist of AND gates only, a second part 520 which may consist of AND gates only, a third part 530 which may consist of at least one of AND, OR, and NOT gates, and a fourth part 540 which may consist of OR gates only. The first part 510 may have $Terms_t(x)$ as inputs and may output $TermBeforeSeq_t(x)$. The relationship between $Term_t(x)$ and $TermBeforeSeq_t(x)$ may be defined in Equation (6). The second part 520 may have TermBeforeSeq$_i$(x), which may be the outputs of the first part 510, as inputs and may output Cond$_i$(x). The relationship between TermBeforeSeq$_i$(x) and Cond$_i$(x) may be defined in Equation (7). The third part 530 may have both TermBeforeSeq$_i$(x), which may be the outputs of the first part 510 and the inputs of the second part 520, and Cond$_i$(x), which may be the outputs of the second part 520, as inputs. The third part 530 may output Val$_j$(x), which may be the inputs of the fourth part 540. The relationship between Val$_j$(x) and TermBeforeSeq$_i$(x) and Cond$_i$(x) may be defined in Equation (9). The fourth part 540 may have Val$_j$(x) as inputs and may output FUNC(x,y). The relationship between FUNC(x,y) and Val$_j$(x) may be defined in Equation (2).

FIG. 6 is a flow chart depicting a process 600 of evaluating a log function by a logic circuit with an optimized number of AND/OR switches created according to an exemplary embodiment of the present invention. The process 600 starts with Step 602 at which a logic function FUNC(x,y) may be defined in terms of IF-operators, EQ-operators, and SEQ-operators. Next, at Step 604, all possible sets are evaluated. For example, Term$_i$(x) is evaluated for each operator OP$_i$ according to Def. 1; AllParents(i) is evaluated for each operator OP$_i$ according to Def. 2; AllParentsBeforeSeq(i) is evaluated for each operator OP$_i$ according to Def. 3; AllSeqParents(i) is evaluated for each operator OP$_i$ according to Def. 4; and common(i,s) is evaluated for each operators OP$_i$ and OP$_s$ according to Def. 5.

Then, at Step 606, a logic circuit with an optimized number of AND/OR switches is created. The logic circuit may have four parts. The first part may consist of AND gates only, and may have Term$_i$(x) as inputs and TermBeforeSeq$_i$(x) as outputs, wherein the relationship between Term$_i$(x) and TermBeforeSeq$_i$(x) may be defined in Equation (6). The second part may consist of AND gates only, and may have TermBeforeSeq$_i$(x), which may be the outputs of the first part, as inputs, and may have Cond$_i$(x) as outputs, wherein the relationship between TermBeforeSeq$_i$(x) and Cond$_i$(x) may be defined in Equation (7). The third part may consist of at least one of AND, OR, and NOT gates, and may have both TermBeforeSeq$_i$(x), which is the outputs of the first part and the inputs of the second part, and Cond$_i$(x), which is the outputs of the second part, as inputs. The third part may output Val$_j$(x), which may be the inputs of the fourth part. The relationship between Val$_j$(x) and TermBeforeSeq$_i$(x) and Cond$_i$(x) may be defined in equation (9). The fourth part may consist of OR gates only, and may have Val$_j$(x) as inputs and may output FUNC(x,y), wherein the relationship between FUNC(x,y) and Val$_j$(x) may be defined in Equation (2).

The Boolean circuit created by the method of the present invention may have an optimized number of low complexity, and the number of AND/OR switches in the Boolean circuit may be 4 or fewer.

It should be realized that the present invention is not limited to C++ functions described above. The present invention may be applied to functions defined in any other high-level descriptions such as Verilog HDL, VHDL, or the like that have IF, SEQ, and EQ operators.

The present invention may be applied where data inputs $y_1, y_2, \ldots, y_m$ may take multi-bit values. In this case each of data inputs may have the integer value that belongs to the set $\{0, 1, \ldots, 2^k-1\}$.

The present invention may also be applied if some of control inputs $x_1, x_2, \ldots, x_n$ become multi-bit values instead of one bit value. The present invention may then allow the use of SWITCH-operators switch($x_j$) instead of IF-operators for such control inputs. SWITCH-operators may be defined as follows:

```
switch (xj) {
    case A1:
        OPi1;
    case A2:
        OPi2;
    ...........
    case Ak:
        OPik;
}
``` where $A_1, A_2, \ldots, A_k$ are constants, and $OP_{i1}, OP_{i2}, \ldots, OP_{ik}$ are operators chosen from EQ, SEQ, IF, and SWITCH operators. Operators $OP_{i1}, OP_{i2}, \ldots, OP_{ik}$ are called children of the considered SWITCH operator, and the considered SWITCH operator is a parent of Operators $OP_{i1}, OP_{i2}, \ldots, OP_{ik}$.

For each s=1, 2, ..., k, we may determine the function $$\text{Term}_{is}(x)=(x_j==A_s)$$

That is, Term$_{is}$(x)=1 if the value of control input $x_j=A_s$. Otherwise, Term$_{is}$(x) 0.

For example, when $A_s=4$,

```
Switch (x) {
    ......
    case 4:
        OPi;
}
``` and suppose x is a three-bit input, then Term$_i$(x) is defined as $$\text{Term}_i(x)=(x==4)$$

or $$\text{Term}_i(x)=(\neg x[0]) \wedge (\neg x[1]) \wedge (\neg x[2])$$

as far as x=4 if and only if x[0]=0, x[1]=0, x[2]=1, where x[s] is a s-th bit of the variable.

Although the invention has been described with a certain degree of particularity, it should be recognized that elements thereof may be altered by persons skilled in the art without departing from the spirit and scope of the invention. One of the embodiments of the invention may be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in a computer-readable medium, including runtime media such as RAM, ROM and the like, and distribution media such as floppy disks, CD-ROMs, hard disks, and the like. Further, the set of instructions may be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is also understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the system and method of the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for creating a logic circuit with an optimized number of AND/OR switches to evaluate a logic function FUNC(x,y), comprising steps of:
   (a) defining said logic function FUNC(x,y) in terms of control inputs $x_1, x_2, \ldots, x_n$, n>1, data inputs $y_1, y_2, \ldots, y_m$, m>1, and at least one operator $OP_i$, i=$\overline{1,N}$, $\overline{1,N}$=1, 2, 3, ..., N, each of said at least one operator $OP_i$ being an IF-operator, an EQ-operator, or a SEQ-operator;
   (b) evaluating dependency relationship among said at least one operator $OP_i$; and
   (c) creating said logic circuit based on said dependency relationship;
   wherein said step (b) comprises:
   (b1) evaluating $Term_i(x)$ for said each of said at least one operator $OP_i$, wherein $Term_i(x)=1$ when $OP_{par(i)}$ is a SEQ-operator, $Term_i(x)=x_j$ when $OP_{par(i)}$ is an IF-operator with control input $x_j$ and $OP_i$ is a positive child, and $Term_i(x)=\neg x_j$ if $OP_{par(i)}$ is an IF-operator with control input $x_j$ and $OP_i$ is a negative child;
   (b2) evaluating a set AllParents(1)={$par_0(1), par_1(1), \ldots, par_{d(1)}()$} for said each of said at least one operator $OP_i$;
   (b3) evaluating a set AllParentsBeforeSeq(1)={$par_0(1), par_1(1), \ldots, par_{seq(1)-1}(1)$} for said each of said at least one operator $OP_i$;
   (b4) evaluating a set AllSeqParents(1)={$par_{seq(1)}(1), par_{seq(seq(1))}(1), \ldots, par_{d(1)}(i)$} for said each of said at least one operator $OP_i$; and
   (b5) evaluating a set common(i,s)=$par_{d(i,s)}(s)$ for said each of said at least one operator $OP_i$ and $OP_s$.

2. The method of claim 1, wherein said step (c) comprises:
   (c1) creating a first part of said logic circuit, said first part consists of AND gates only and has said $Term_i(x)$ as inputs and $TermBeforeSeq_i(x)$ as outputs, wherein $$TermBeforeSeq_i(x) = \bigwedge_{t \in AllParentsBeforeSeq(i)} Term_i(x), i = \overline{1, N}$$

(c2) creating a second part of said logic circuit, said second part consists of AND gates only and has said $TermBeforeSeq_i(x)$ as inputs and $Cond_i(x)$ as outputs, wherein $$Cond_i(x) = \bigwedge_{t \in \{i\} \cup AllSeqParents(i)} TermBeforeSeq_i(x), i = \overline{1, N}$$

(c3) creating a third part of said logic circuit, said third part consists of AND gates, OR gates, and NOR gates, and has said $TermBeforeSeq_i(x)$ and said $Cond_i(x)$ as inputs and $Val_j(x)$ as outputs, wherein $$Val_j(x) = \bigvee_{i \in Y_j} [Cond_i(x) \cdot \bigwedge_{\substack{s>i \\ s \in Y \setminus Y_j}} \neg \{ \bigwedge_{\substack{t \in \{s\} \cup AllSeqParents(s) \\ t < common(i,s)}} TermBeforeSeq_i(x) \}]$$

(c4) creating a fourth part of said logic circuit, said fourth part consists of OR gates only and has said $Val_j(x)$ as inputs and said FUNC(x,y) as outputs, wherein $$FUNC(x, y) = \bigvee_{j=1}^{m} Val_j(x) \cdot y_j.$$

3. The method of claim 2, wherein said step (a) comprises defining said logic function FUNC(x,y) in a C++ code.

4. The method of claim 2, wherein said logic function FUNC(x,y) is a Boolean function, wherein each of said control inputs, each of said data inputs, and each of said logic function FUNC(x,y) is a one-bit value chosen from 0 and 1.

5. The method of claim 2, wherein each of said control inputs is a one-bit value chosen from 0 and 1, and each of said data inputs is a one-bit value or a multi-bit value and is an integer belonging to a set $\{0, 1, \ldots, 2^k-1\}$.

6. A method for creating a logic circuit with an optimized number of AND/OR switches to evaluate a logic function FUNC(x,y), comprising steps of:
   (a) defining said logic function FUNC(x,y) in terms of control input $x_1, x_2, \ldots, x_n$, n>1, data inputs $y_1, y_2, \ldots, y_m$, m>1, and at least one operator $OP_i$, i=$\overline{1, N}$, 1, NN=1, 2, 3, ..., N, each of said at least one operator $OP_i$ being an IF-operator, an EQ-operator, or a SWITCH-operator;
   (b) evaluating dependency relationship among said at least one operator $OP_i$; and
   (c) creating said logic circuit based on said dependency relationship;
   wherein said step (b) comprises:
   (b1) evaluating $Term_i(x)$ for said each of said at least one operator $OP_i$, wherein $Term_i(x)=1$ when $OP_{par(i)}$ is a SEQ-operator, and $Term_i(x)=(x_j==A_s)$ when said operator $OP_i$ is a SWITCH-operator;
   (b2) evaluating a set AllParents(1)={$par_0(1), par_1(1), \ldots, par_{d(i)}(i)$} for said each of said at least one operator $OP_i$;
   (b3) evaluating a set AllParentsBeforeSeq(1)={$par_0(1), par_1(1), \ldots, par_{seq(1)-1}(1)$} for said each of said at least one operator $OP_i$;
   (b4) evaluating a set AllSeqParents(1)={$par_{seq(1)}(1), par_{seq(seq(1))}(1), \ldots, par_{d(1)}(i)$} for said each of said at least one operator $OP_i$; and
   (b5) evaluating a set common(i,s)=$par_{d(i,s)}(s)$ for said each of said at least one operator $OP_i$ and $OP_s$.

7. The method of claim 6, wherein said step (c) comprises:
   (c1) creating a first part of said logic circuit, said first part consists of AND gates only and has said $Term_i(x)$ as inputs and TermBeforeSeq$_i$(x) as outputs, wherein $$TermBeforeSeq_i(x) = \bigwedge_{t \in AllParentsBeforeSeq(i)} Term_i(x), i = \overline{1, N}$$

(c2) creating a second part of said logic circuit, said second part consists of AND gates only and has said TermBeforeSeq$_i$(x) as inputs and Cond$_i$(x) as outputs, wherein $$Cond_i(x) = \bigwedge_{t \in \{i\} \cup AllSeqParents(i)} TermBeforeSeq_i(x), i = \overline{1, N}$$

(c3) creating a third part of said logic circuit, said third part consists of AND gates, OR gates, and NOR gates, and has said TermBeforeSeq$_i$(x) and said Cond$_i$(x) as inputs and Val$_j$(x) as outputs, wherein $$Val_j(x) = \bigvee_{i \in Y_j} [Cond_i(x) \cdot \bigwedge_{\substack{s > i \\ s \in Y \setminus Y_j}} \neg \{ \bigwedge_{\substack{t \in \{s\} \cup AllSeqParents(s) \\ t < common(i,s)}} TermBeforeSeq_i(x) \}]$$

(c4) creating a fourth part of said logic circuit, said fourth part consists of OR gates only and has said Val$_j$(x) as inputs and said FUNC(x,y) as outputs, wherein $$FUNC(x, y) = \bigvee_{j=1}^{m} Val_j(x) \cdot y_j.$$

8. The method of claim 7, wherein said step (a) comprises defining said logic function FUNC(x,y) in a C++ code.

9. The method of claim 7, wherein at least one of said control inputs is a multi-bit value.

10. A computer-readable medium having computer-executable instructions for performing a method for creating a logic circuit with an optimized number of AND/OR switches to evaluate a logic function FUNC(x,y), said method comprising steps of:
(a) defining said logic function FUNC(x,y) in terms of control inputs $x_1, x_2, \ldots, x_n$, n>1, data inputs $y_1, y_2, \ldots, y_m$, m>1, and at least one operator OP$_i$, i=$\overline{1, N}$, $\overline{1, N}$=1, 2, 3, ..., N, each of said at least one operator OP$_i$ being an IF-operator, an EQ-operator, or a SEQ-operator;
(b) evaluating dependency relationship among said at least one operator OP$_i$; and
(c) creating said logic circuit based on said dependency relationship;
wherein said step (b) comprises:
(b1) evaluating Term$_i$(x) for said each of said at least one operator OP$_i$, wherein Term$_i$(x)=1 when OP$_{par(i)}$ is a SEQ-operator, Term$_i$(x)=$x_j$ when OP$_{par(i)}$ is an IF-operator with control input $x_j$ and OP$_i$ is a positive child, and Term$_i$(x)=$\neg x_j$ if OP$_{par(i)}$ is an IF-operator with control input $x_j$ and OP$_i$ is a negative child;
(b2) evaluating a set AllParents(1)={par$_0$(1), par$_1$(1), ..., par$_{d(1)}$(1)} for said each of said at least one operator OP$_i$;
(b3) evaluating a set AllParentsBeforeSeq(1)={par$_0$(1), par$_1$(1), ..., par$_{seq(1)-1}$(1)} for said each of said at least one operator OP$_i$;
(b4) evaluating a set AllSeqParents(1)={par$_{seq(1)}$(1), par$_{seq(seq(1))}$(1), ..., par$_{d(i)}$(1)} for said each of said at least one operator OP$_i$; and
(b5) evaluating a set common(i,s)=par$_{d(i,s)}$(s) for said each of said at least one operator OP$_i$ and OP$_s$.

11. The computer-readable medium of claim 10, wherein said step (c) comprises:
(c1) creating a first part of said logic circuit, said first part consists of AND gates only and has said Term$_i$(x) as inputs and TermBeforeSeq$_i$(x) as outputs, wherein $$TermBeforeSeq_i(x) = \bigwedge_{t \in AllParentsBeforeSeq(i)} Term_i(x), i = \overline{1, N}$$

(c2) creating a second part of said logic circuit, said second part consists of AND gates only and has said TermBeforeSeq$_1$(x) as inputs and Cond$_1$(x) as outputs, wherein $$Cond_i(x) = \bigwedge_{t \in \{i\} \cup AllSeqParents(i)} TermBeforeSeq_i(x), i = \overline{1, N}$$

(c3) creating a third part of said logic circuit, said third part consists of AND gates, OR gates, and NOR gates, and has said TermBeforeSeq$_1$(x) and said Cond$_1$(x) as inputs and Val$_j$(x) as outputs, wherein $$Val_j(x) = \bigvee_{i \in Y_j} [Cond_i(x) \cdot \bigwedge_{\substack{s > i \\ s \in Y \setminus Y_j}} \neg \{ \bigvee_{\substack{t \in \{s\} \cup AllSeqParents(s) \\ t < common(i,s)}} TermBeforeSeq_i(x) \}]$$

(c4) creating a fourth part of said logic circuit, said fourth part consists of OR gates only and has said Val$_j$(x) as inputs and said FUNC(x,y) as outputs, wherein $$FUNC(x, y) = \bigvee_{j=1}^{m} Val_j(x) \cdot y_j.$$

12. The computer-readable medium of claim 11, wherein said step (a) comprises defining said logic function FUNC(x,y) in a C++ code.

13. The computer-readable medium of claim 11, wherein said logic function FUNC(x,y) is a Boolean function, and each of said control inputs, each of said data inputs, and each of said logic function FUNC(x,y) is a one-bit value chosen from 0 and 1.

14. The computer-readable medium of claim 11, wherein each of said control inputs is a one-bit value chosen from 0 and 1, and each of said data inputs is a one-bit value or a multi-bit value and is an integer belonging to a set $\{0, 1, \ldots, 2^k-1\}$.

15. A computer-readable medium having computer-executable instructions for performing a method for creating a logic circuit with an optimized number of AND/OR switches to evaluate a logic function FUNC(x,y), said method comprising steps of:
(a) defining said logic function FUNC(x,y) in terms of control input $x_1, x_2, \ldots, x_n$, n>1, data inputs $y_1, y_2, \ldots, y_m$, m>1, and at least one operator OP$_i$, i=$\overline{1,N}$, $\overline{1, N}$=1, 2, 3, ..., N, each of said at least one operator OP$_i$ being an IF-operator, an EQ-operator, or a SWITCH-operator;
(b) evaluating dependency relationship among said at least one operator OP$_i$; and
(c) creating said logic circuit based on said dependency relationship;
wherein said step (b) comprises:
(b1) evaluating Term$_i$(x) for said each of said at least one operator OP$_i$, wherein Term$_i$(x)=1 when OP$_{par(1)}$ is a SEQ-operator, and Term$_i$(x)=($x_j$==A$_s$) when said operator OP$_i$ is a SWITCH-operator;

(b2) evaluating a set AllParents(1)={$par_0(1)$, $par_1(1)$, ..., $par_{d(1)}(1)$} for said each of said at least one operator $OP_i$;

(b3) evaluating a set AllParentsBeforeSeq(1)={$par_0(1)$, $par_1(1)$, ..., $par_{seq(1)-1}(1)$} for said each of said at least one operator $OP_i$;

(b4) evaluating a set AllSeqParents(1)={$par_{seq(1)}(1)$, $par_{seq(seq(1))}(1)$, ..., $par_{d(1)}(1)$} for said each of said at least one operator $OP_i$; and (b5) evaluating a set common(i,s)=$par_{d(i,s)}(s)$ for said each of said least one operator $OP_i$ and $OP_s$.

16. The computer-readable medium of claim 15, wherein said step (c) comprises:

(c1) creating a first part of said logic circuit, said first part consists of AND gates only and has said $Term_i(x)$ as inputs and $TermBeforeSeq_i(x)$ as outputs, wherein $$TermBeforeSeq_i(x) = \bigwedge_{t \in AllParentsBeforeSeq(i)} Term_i(x), i = \overline{1, N}$$

(c2) creating a second part of said logic circuit, said second part onsists of AND gates only and has said $TermBeforeSeq_i(x)$ as inputs and $Cond_i(x)$ as outputs, wherein $$Cond_i(x) = \bigwedge_{t \in \{i\} \cup AllSeqParents(i)} TermBeforeSeq_i(x), i = \overline{1, N}$$

(c3) creating a third part of said logic circuit, said third part consists of AND gates, OR gates, and NOR gates, and has said $TermBeforeSeq_i(x)$ and said $Cond_1(x)$ as inputs and $Val_j(x)$ as outputs, wherein $$Val_j(x) = \bigvee_{i \in Y_j} [Cond_i(x) \cdot \bigwedge_{\substack{s > i \\ s \in Y \setminus Y_j}} \neg \{ \bigwedge_{\substack{t \in \{s\} \cup AllSeqParents(s) \\ t < common(i,s)}} TermBeforeSeq_i(x) \}]$$

(c4) creating a fourth part of said logic circuit, said fourth part consists of OR gates only and has said $Val_j(x)$ as inputs and said FUNC(x,y) as outputs, wherein $$FUNC(x, y) = \bigvee_{j=1}^{m} Val_j(x) \cdot y_j.$$

17. The computer-readable medium of claim 16, wherein said step (a) comprises defining said logic function FUNC(x,y) in a C++ code.

18. The computer-readable medium of claim 16, wherein at least one of said control inputs is a multi-bit value.

19. An apparatus for creating a logic circuit with an optimized number of AND/OR switches to evaluate a logic function FUNC(x,y), comprising:

(a) means for defining said logic function FUNC(x,y) in terms of control inputs $x_1, x_2, ..., x_n$, n>1, data inputs $y_1, y_2, ..., y_m$, m>1, and at least one operator $OP_i$, i=1, N, 1, N=1, 2, 3, ..., N, each of said at least one operator $OP_i$ being an IF-operator, an EQ-operator, or a SEQ-operator;

(b) means for evaluating dependency relationship among said at least one operator $OP_i$; and (c) means for creating said logic circuit based on said dependency relationship;

wherein said means for evaluating comprises:

(b1) means for evaluating $Term_i(x)$ for said each of said at least one operator $OP_i$, wherein $Term_1(x)$=1 when $OP_{par(i)}$ is a SEQ-operator, $Term_i(x)=x_j$ when $OP_{par(1)}$ is an IF-operator with control input $x_j$ and $OP_i$ is a positive child, and $Term_i(x) = \neg x_j$ if $OP_{par(1)}$ is an IF-operator with control input $x_j$ and $OP_i$ is a negative child;

(b2) means for evaluating a set AllParents(1)={$par_0(1)$, $par_1(1)$, ..., $par_{d(i)}(i)$} for said each of said at least one operator $OP_i$;

(b3) means for evaluating a set AllParentsBeforeSeq(i)={$par_0(1)$, $par_1(l)$, ..., $par_{seq(i)-1}(1)$}-for said each of said at least one operator $OP_i$, and (b4) means for evaluating a set AllSeqParents(1)={$par_{seq(1)}(1)$, $par_{seq(seq(1))}(1)$, ..., $par_{d(i)}(1)$} for said each of said at least one operator $OP_i$; and (b5) means for evaluating a set common(i,s)=$par_{h(i,s)}(s)$ for said each of said at least one operator $OP_i$ and $OP_s$.

20. The apparatus of claim 19, wherein said means for creating comprises:

(c1) means for creating a first part of said logic circuit, said first part consists of AND gates only and has said $Term_i(x)$ as inputs and $TermBeforeSeq_i(x)$ as outputs, wherein $$TermBeforeSeq_i(x) = \bigwedge_{t \in AllParentsBeforeSeq(i)} Term_i(x), i = \overline{1, N}$$

(c2) means for creating a second part of said logic circuit, said second part consists of AND gates only and has said $TermBeforeSeq_i(x)$ as inputs and $Cond_i(x)$ as outputs, wherein $$Cond_i(x) = \bigwedge_{t \in \{i\} \cup AllSeqParents(i)} TermBeforeSeq_i(x), i = \overline{1, N}$$

(c3) means for creating a third part of said logic circuit, said third part consists of AND gates, OR gates, and NOR gates, and has said $TermBeforeSeq_i(x)$ and said $Cond_1(x)$ as inputs and $Val_j(x)$ as outputs, wherein $$Val_j(x) = \bigvee_{i \in Y_j} [Cond_i(x) \cdot \bigwedge_{\substack{s > i \\ s \in Y \setminus Y_j}} \neg \{ \bigwedge_{\substack{t \in \{s\} \cup AllSeqParents(s) \\ t < common(i,s)}} TermBeforeSeq_i(x) \}]$$

(c4) means for creating a fourth part of said logic circuit, said fourth part consists of OR gates only and has said $Val_j(x)$ as inputs and said FUNC(x,y) as outputs, wherein $$FUNC(x, y) = \bigvee_{j=1}^{m} Val_j(x) \cdot y_j.$$

21. The apparatus of claim 20, wherein said means for defining comprises means for defining said logic function FUNC(x,y) in a C++ code.

22. The apparatus of claim 20, wherein said logic function FUNC(x,y) is a Boolean function, and each of said control inputs, each of said data inputs, and each of said logic function FUNC(x,y) is a one-bit value chosen from 0 and 1.

23. The apparatus of claim 20, wherein each of said control inputs is a one-bit value chosen from 0 and 1, and each of said data inputs is a one-bit value or a multi-bit value and is an integer belonging to a set {0, 1, ..., $2^k-1$}.

* * * * *